United States Patent
Kanayama et al.

(12)

(10) Patent No.: US 10,210,796 B2
(45) Date of Patent: Feb. 19, 2019

(54) LIGHTING DEVICE AND MOVABLE BODY

(71) Applicant: PANASONIC INTELLECTUAL PROPERTY MANAGEMENT CO., LTD., Osaka (JP)

(72) Inventors: Yoshihiko Kanayama, Hyogo (JP); Yasuharu Ueno, Osaka (JP); Tomoyuki Ogata, Osaka (JP); Hiroya Tsuji, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/899,566

(22) Filed: Feb. 20, 2018

(65) Prior Publication Data

US 2018/0247585 A1    Aug. 30, 2018

(30) Foreign Application Priority Data

Feb. 27, 2017   (JP) .................. 2017-035226

(51) Int. Cl.
| | |
|---|---|
| H05B 37/02 | (2006.01) |
| G09G 3/32 | (2016.01) |
| H01L 25/075 | (2006.01) |
| H01L 33/60 | (2010.01) |
| H05B 33/08 | (2006.01) |

(52) U.S. Cl.
CPC ........... *G09G 3/32* (2013.01); *H01L 25/0753* (2013.01); *H01L 33/60* (2013.01); *H05B 33/089* (2013.01); *H05B 33/0824* (2013.01); *H05B 33/0851* (2013.01); *H05B 37/02* (2013.01); *H05B 33/0854* (2013.01)

(58) Field of Classification Search
CPC .................................................. H05B 33/0854
USPC ................ 315/152, 153, 154, 291, 312, 324
See application file for complete search history.

(56) References Cited

U.S. PATENT DOCUMENTS

| | | | |
|---|---|---|---|
| 6,411,047 B1* | 6/2002 | Okazaki .................... G09G 3/32 | |
| | | | 315/169.1 |
| 8,344,651 B2 | 1/2013 | Takaki et al. | |
| 2011/0007104 A1* | 1/2011 | Nakazawa ........... G09G 3/3413 | |
| | | | 345/690 |
| 2014/0139499 A1* | 5/2014 | Hussain ............. H05B 33/0827 | |
| | | | 345/204 |

FOREIGN PATENT DOCUMENTS

JP    2003-158300    5/2003

* cited by examiner

*Primary Examiner* — Thuy Vinh Tran
(74) *Attorney, Agent, or Firm* — Greenblum & Bernstein, P.L.C.

(57) ABSTRACT

In a lighting device provided with a light source module including a plurality of light sources, insufficiency of luminous intensity, illuminance unevenness, and the like due to a low-light light source are compensated for. The lighting device includes the light source module which is composed of the plurality of light sources in a matrix and mounted on a board. A drive circuit individually supplies power to the light sources. A processor controls a lighting status of each of the light sources via the drive circuit. The processor determines a low-light light source that is lower in luminous intensity than at least one light source among the plurality of light sources, and causes at least one light source adjacent to the low-light light source to emit light with a higher luminous intensity than the at least one other light source.

15 Claims, 8 Drawing Sheets

LIGHTING DEVICE AND MOVABLE BODY

CROSS REFERENCE TO RELATED APPLICATION

The entire disclosure of Japanese Patent Application No. 2017-035226 filed on Feb. 27, 2017, including specification, claims, drawings and abstract, is incorporated herein by reference in its entirety.

BACKGROUND OF THE INVENTION

1. Field of the Invention

The present disclosure relates to a lighting device and a movable body.

2. Description of the Related Art

Japanese Patent Laid-Open Publication No. 2003-158300 discloses a light-emitting diode (hereinafter referred to as an LED) display device provided with a plurality of LEDs arranged in a dot matrix and driving means capable of causing the LEDs to independently emit light. The publication describes that the LED display device identifies an LED having an abnormality, such as a lighting failure or undesired light emission, using a relatively simple configuration.

A light source module having a plurality of LEDs arranged in a matrix on a board may be used as a lighting device. In this case, if a given one of the LEDs fails to light up or enters a state with low emission intensity, illuminance unevenness may appear in a region irradiated with light by the lighting device to cause a reduction in visibility.

It is an advantage of the present disclosure to inhibit illuminance unevenness due to a low-light light source through compensation with another light source in a lighting device provided with a light source module including a plurality of light sources.

SUMMARY OF THE INVENTION

A lighting device according to the present disclosure includes a light source module which is composed of a plurality of light sources in a matrix mounted on a board, a drive circuit which individually supplies power to the light sources, and a processor which controls a lighting status of each of the light sources via the drive circuit. The processor includes a detection portion which detects a low-light light source that is lower in luminous intensity than other light source, among the plurality of light sources, and an adjustment portion which causes at least one light source adjacent to the low-light light source to emit light with higher luminous intensity than the other light source.

Examples of the low-light light source here include a light source in a state with emission intensity lower than a predetermined luminous intensity and an unlighted light source.

A lighting device and a movable body according to the present disclosure may inhibit illuminance unevenness due to a low-light light source through compensation with another light source. This results in resolution of the problem of reduction in visibility in an irradiated region.

DESCRIPTION OF PREFERRED EMBODIMENT

An embodiment of the present disclosure will be described below in detail with reference to the accompanying drawings. Specific shapes, materials, numerical values, directions, and the like in the description are mere illustrations for facilitating understanding of the present disclosure and can be appropriately changed in accordance with the purpose, the intended use, the specification, and the like. If the following description includes embodiments, modifications, and the like, appropriately combined use of characteristic portions thereof is initially intended.

Figure 1:
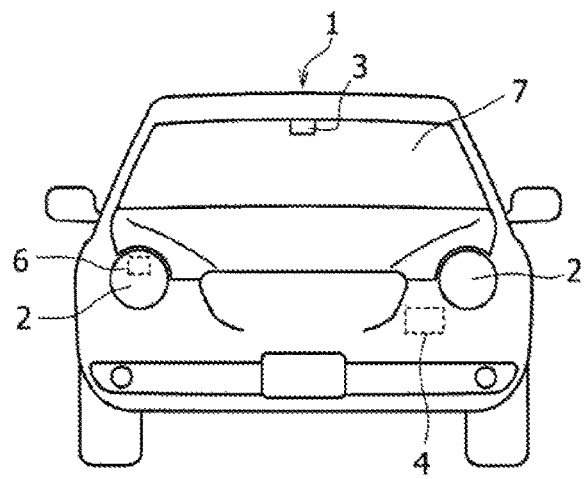
FIG. 1 is a front view showing an automobile equipped with a lighting device according to an embodiment of the present disclosure.

FIG. 1 is a front view of an automobile 1 which is equipped with lighting devices 2 according to an embodiment of the present disclosure. As shown in FIG. 1, the automobile 1 includes the lighting devices 2, a battery 4, and a processor 6. The lighting devices 2 are arranged as headlamps on two sides in a width direction of a front end of the automobile 1. The battery 4 is loaded in an engine compartment. Each lighting device 2 is turned on with power supplied from the battery 4.

The processor 6 has a function of controlling, e.g., turn-on/turn-off of a light source included in the lighting device 2. The processor 6 may be installed inside a case of the lighting device 2 or may be installed outside the case. If the processor 6 is installed outside the case, the processor 6 may be constructed as a part of a processor which performs integrated control on the automobile 1.

The automobile 1 may be loaded with a camera 3 which monitors the front in a vehicle traveling direction. The camera 3 is attached, for example, on an inner side and at an upper portion of a windshield 7 between the windshield 7 and a rearview mirror (not shown) in a vehicle interior. An image captured by the camera 3 is transmitted to, for example, a control device of the automobile 1 and can be used in a mechanism, such as an automatic brake. The image may be transmitted to the processor 6 of the lighting device 2 and be used to detect illuminance unevenness of the lighting device 2.

Figure 2:
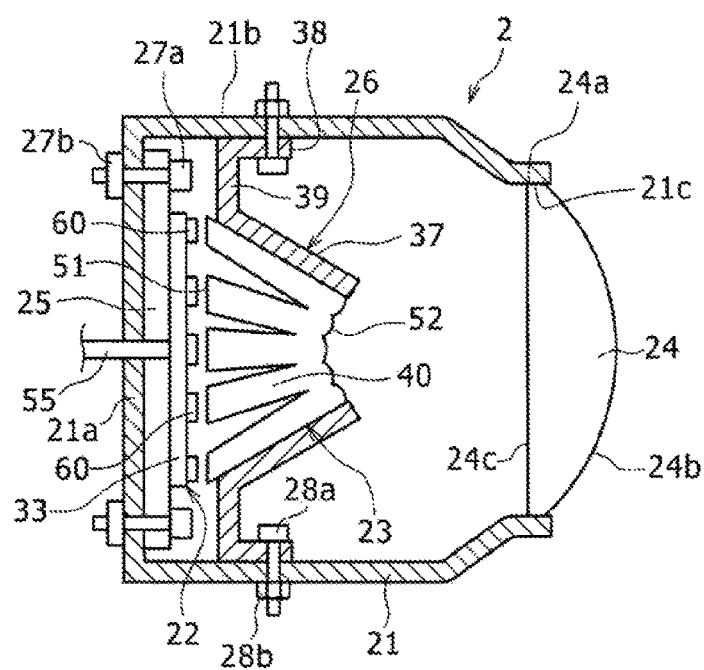
FIG. 2 is a partially sectional view of the lighting device in FIG. 1.
Figure 3:
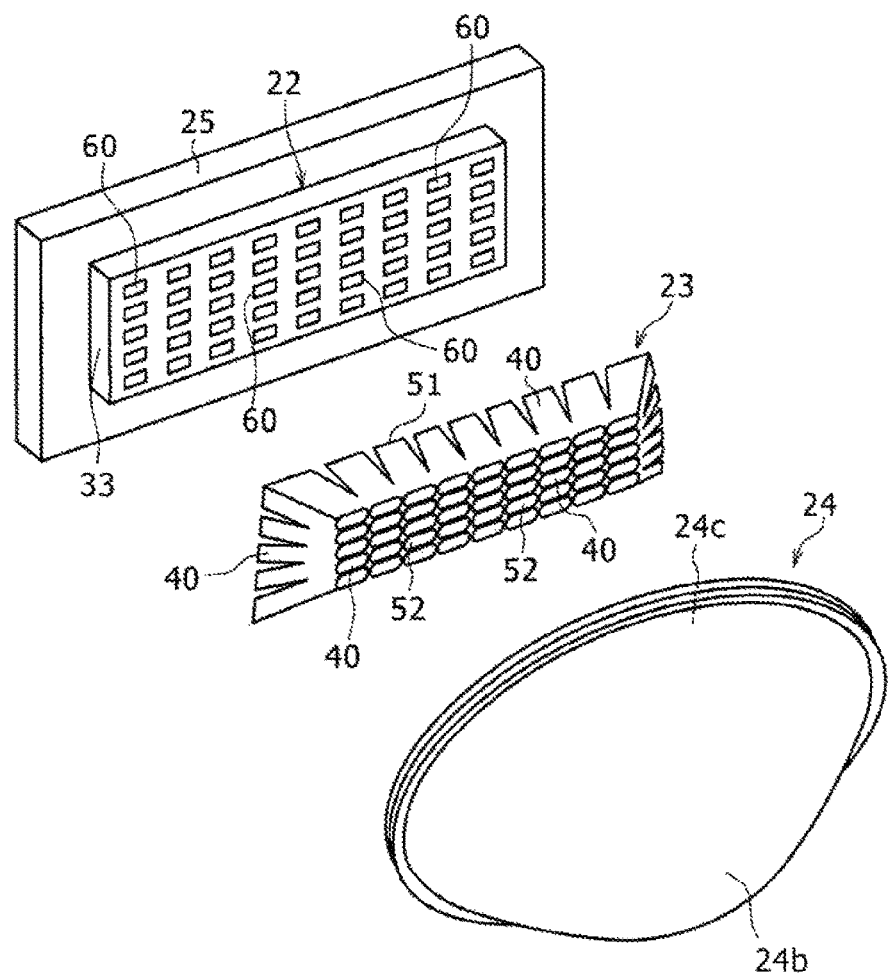
FIG. 3 is an exploded perspective view of a light source module, a light guide member, and a projection lens when the lighting device in FIG. 1 is disassembled.

FIG. 2 is a partially sectional view of the lighting device 2, and FIG. 3 is an exploded perspective view of a light source module 22, a primary lens 23, and a projection lens 24 when the lighting device 2 is disassembled. The structure of the lighting device 2 will be described below with reference to FIGS. 2 and 3.

As shown in FIG. 2, the lighting device 2 includes the light source module 22, the primary lens 23 as a light guide member, and the projection lens (or projector lens) 24 inside a case 21. The light source module 22 has a board 33 and a plurality of light sources 60 which are mounted at intervals on an obverse side (the projection lens 24 side) of the board 33. The light source module 22 is fixed to a board attachment plate 25 with a fastening member, an adhesive, or the like as an example of fixation means. The board attachment plate 25 is attached to, for example, a flat plate portion 21a which forms a bottom of the case 21 with, for example, bolts 27a and nuts 27b or the like.

Each light source 60 of the light source module 22 is preferably composed of a plurality of light-emitting diodes (hereinafter referred to as LEDs). A cable 55 for supplying power to the light sources 60 is electrically connected to the light source module 22. The cable 55 is led out from a case inner side to a case outer side through, for example, a through-hole formed in the board attachment plate 25 and a through-hole formed in the case bottom 21a, and is connected to a drive circuit (to be described later).

The primary lens 23 is disposed on a light exit side of the plurality of light sources 60. The primary lens 23 has a plurality of light guide portions 40 identical in number to the light sources 60. Each light guide portion 40 includes a light entrance face 51 which is arranged on the light exit side of the light sources 60 and a light exit face 52 which is disposed at an end on the opposite side from the light entrance face 51. The plurality of light guide portions 40 correspond one-to-one to the plurality of light sources 60. Each light guide portion 40 guides light from the corresponding to the light source 60, from the light entrance face 51 to the light exit face 52. A portion around an end on a light exit face side of each light guide portion 40 is integrally formed with a portion around an end on a light exit face side of the adjacent light guide portion 40. As a result, the plurality of light guide portions 40 are coupled to constitute the integral primary lens 23.

The primary lens 23 is fixed to a case side wall portion 21b with, for example, a primary fixation member 26. The primary fixation member 26 has an annular portion 37 which restrains a side portion of the primary lens 23 in contact with the side portion around the entire perimeter of the primary lens 23, a plate-like attached portion 38 having an attached surface corresponding to an inner side surface of the case side wall portion 21b, and a coupling portion 39 which couples the annular portion 37 and the attached portion 38. The attached portion 38 is attached to the case side wall portion 21b with bolts 28a and nuts 28b as examples of fixation means, thereby fixing the primary lens 23 to the case 21.

The projection lens 24 is arranged to be opposed to the light exit faces 52 of the primary lens 23 on the opposite side from the light sources 60. A surface on a light exit side of the projection lens 24 is composed of a convex surface 24b while a surface on an entrance side of the projection lens 24 is composed of a flat surface 24c. The case 21 has an opening on one side in an axial direction (a normal direction of a bottom surface of the bottom 21a), and the opening has a cylinder inner peripheral surface 21c. In the projection lens 24, the rim portion 24a is fixed to the cylinder inner peripheral surface 21c of the case 21.

As shown in FIG. 3, the plurality of light sources 60 are arranged in a matrix on a surface of the board 33. FIG. 3 shows an example where the light sources 60 are arranged in five rows and nine columns. That is, in the present embodiment, a matrix which the plurality of light sources 60 form has more columns (the nine columns) than rows (the five rows).

The primary lens 23 has the light guide portions 40 identical in number to the light sources 60. Light from each light source 60 enters the light entrance face 51 of the light guide portion 40 corresponding to the light source 60 and exits the light exit face 52 of the corresponding light guide portion 40. The plurality of light exit faces 52 of the primary lens 23 are arranged in a matrix with five rows and nine columns so as to correspond to the arrangement of the plurality of light sources 60.

Light exiting each light source 60 passes through the corresponding light guide portion 40 and exits the light exit face 52 of the light guide portion 40. Light exiting the light exit face 52 of each light guide portion 40 enters the flat surface 24c of the projection lens 24. The projection lens 24 has the convex surface 24b on the opposite side from the light source module 22. Light entering the projection lens 24 exits from the convex surface 24b of the projection lens 24 to outside the lighting device 2.

Note that light exit faces of a plurality of light sources and a primary lens may be arranged in N rows and M columns (N and M are arbitrary natural numbers), unlike the example shown in FIG. 3. Preferably, N<M holds. A light source may be composed of a semiconductor laser element as an example of another light-emitting element.

Figure 4:
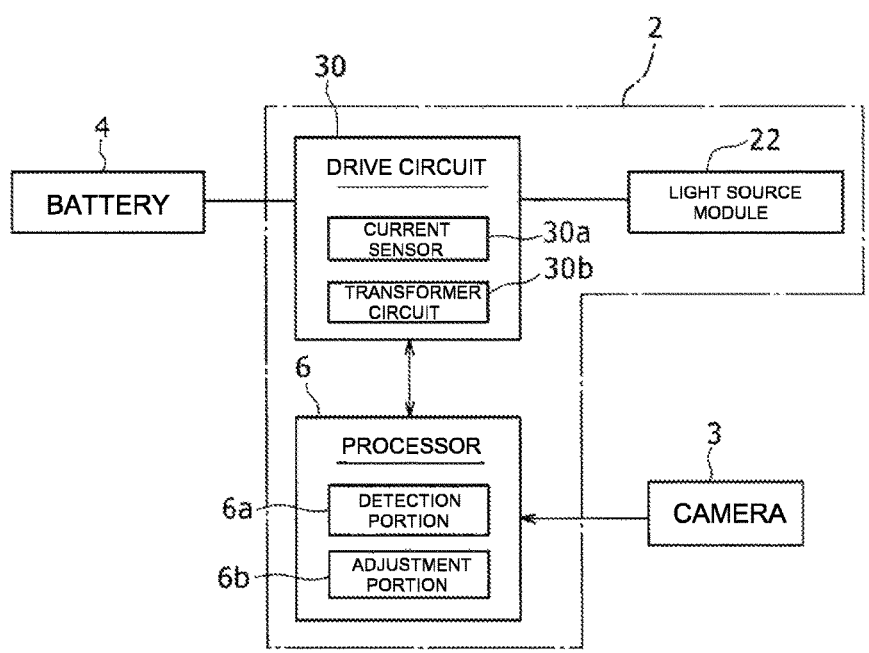
FIG. 4 is a functional block diagram including the lighting device.

Control in the lighting device 2 will be described with reference to FIG. 4. FIG. 4 is a functional block diagram including the lighting device 2.

As shown in FIG. 4, the lighting device 2 includes a drive circuit 30 in addition to the light source module 22 and the processor 6. The drive circuit 30 is electrically connected to the battery 4. The drive circuit 30 has, for example, a plurality of respective switching portions corresponding to the light sources 60 included in the lighting device 2. On-off control of each switching portion is independently performed on the basis of a signal from the processor 6. Each switching portion is composed of, for example, a transistor or the like. The light source 60 corresponding to one of the switching portions which is controlled to be on by the processor 6 is supplied with power from the battery 4 and is turned on. As described above, each light source 60 is individually supplied with power by the drive circuit 30, and a lighting status (e.g., on/off) of the light source 60 is controlled.

In the present embodiment, the drive circuit 30 has a current sensor 30a and a transformer circuit 30b for each switching portion. The current sensor 30a detects a current flowing through the light source 60 via the switching portion and transmits a detection signal to the processor 6. The transformer circuit 30b operates on the basis of a signal from the processor 6 and is configured to be capable of changing a voltage to be applied from the battery 4 in a plurality of levels for each light source 60.

Note that although an example using a current sensor to detect the lighting status of each light source 60 will be described in the present embodiment, the present disclosure is not limited to this. The lighting status of each light source 60 may be detected using a voltage sensor which detects a voltage applied to the light source 60 in combination with the current sensor.

The processor 6 is preferably composed of, for example, a microcomputer. The processor 6 includes a central processing unit (CPU) and storage portions, such as a random access memory (RAM) and a read only memory (ROM). The CPU has a function of reading out a program and the like stored in advance in the storage portions and executing the program. The RAM has a function of temporarily storing a program and processing data that has been read out. The ROM has a function of storing, in advance, a control program, a predetermined threshold, and the like. The processor 6 can be implemented by software executed by the microcomputer. A part of the processor 6, however, may be composed of hardware.

The processor 6 has a detection portion 6a and an adjustment portion 6b. The detection portion 6a has a function of detecting a low-light light source that is lower in luminous intensity than the other light sources 60 among the plurality of light sources 60. More specifically, the detection portion 6a detects the lighting status of each light source 60 on the basis of a current in the light source 60 transmitted from the current sensor 30a of the drive circuit 30. For example, if a current flowing through the given light source 60 is smaller than a predetermined threshold, the detection portion 6a detects that the light source 60 is a low-light light source. The detection portion 6a can judge the lighting status of the light source 60 through comparison with first and second thresholds. In this case, the detection portion 6a may judge that the light source 60 is a low-light light source if a current in the light source 60 is smaller than the first threshold, and judge that the light source 60 is an unlighted light source if the current in the light source 60 is smaller than the second threshold (<the first threshold).

The adjustment portion 6b of the processor 6 has a function of causing the light source 60 adjacent to a low-light light source detected by the detection portion 6a to emit light with higher power than the other light sources 60 (i.e., the light sources 60 in a normal light-emitting state). More specifically, the adjustment portion 6b transmits a signal to the transformer circuit 30b of the drive circuit 30 corresponding to the adjacent light source 60 to increase a voltage to be applied to the light source 60. With this operation, the adjacent LED emits light with higher luminous intensity than the other light sources 60 in the normal light-emitting state that emit light at a voltage before transformation.

Figure 5A:
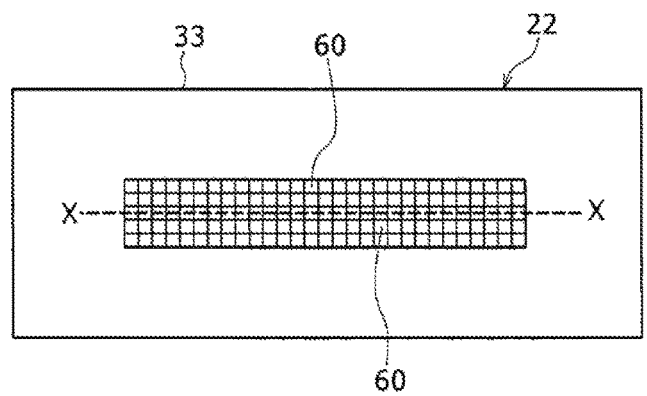
FIG. 5A is a front view of the light source module.
Figure 5B:
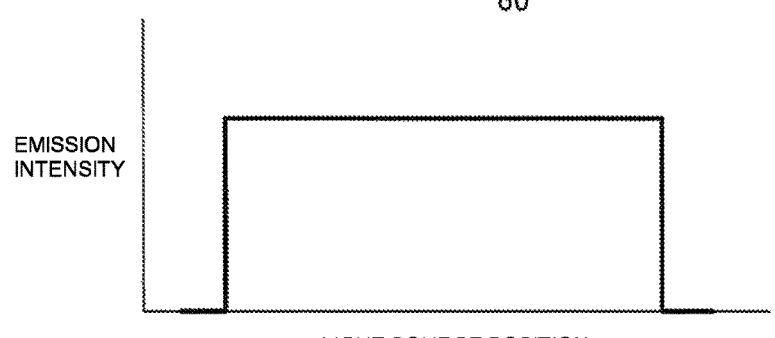
FIG. 5B is a chart showing a light source position located on line X-X in FIG. 5A and emission intensity.
Figure 5C:
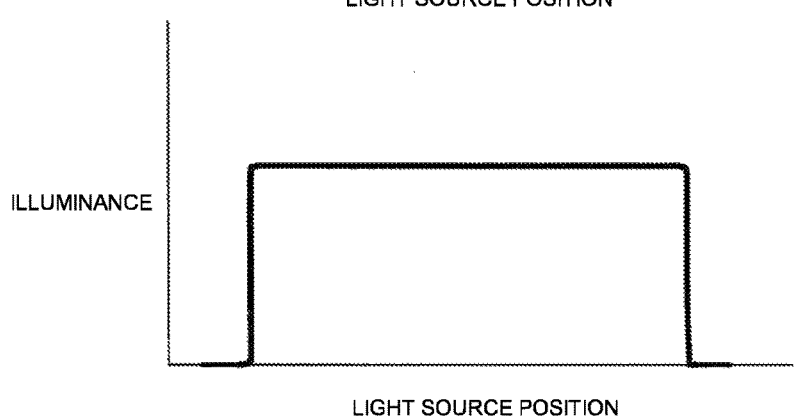
FIG. 5C is a chart showing illuminance corresponding to the emission intensity in FIG. 5B.

An example of the control in the lighting device 2 according to the present embodiment will be described with reference to FIGS. 5 to 7. FIG. 5A is a front view of the light source module 22, FIG. 5B is a chart showing a light source position located on line X-X in FIG. 5A and emission intensity, and FIG. 5C is a chart showing illuminance corresponding to the emission intensity in FIG. 5B. FIGS. 6A to 6C are a view and charts corresponding to FIGS. 5A to 5C in a case where the light source module 22 includes a low-light light source. FIG. 7A to 7C are a view and charts corresponding to FIGS. 5A to 5C in a case where two light sources adjacent to the low-light light source in a row direction are caused to emit light with high luminous intensity.

As shown in FIG. 5A, the light source module 22 having the light sources 60 arranged in a matrix with five rows and 29 columns on the board 33 will be described here as an example. Although the description will be given with a focus on the light sources 60 located in a third row (on line X-X) at the center in a vertical direction among the five rows, the same applies to the light sources 60 in the other rows.

If the light sources 60 on line X-X shown in FIG. 5A are in a normal lighted state, the light sources 60 emit light with approximately equal intensities. As shown in FIG. 5B, a graph of emission intensity flattens out regardless of a light source position on the abscissa axis. In this case, illuminance on an irradiated surface illuminated by the light sources 60 is approximately uniform, as shown in FIG. 5C.

Figure 6A:
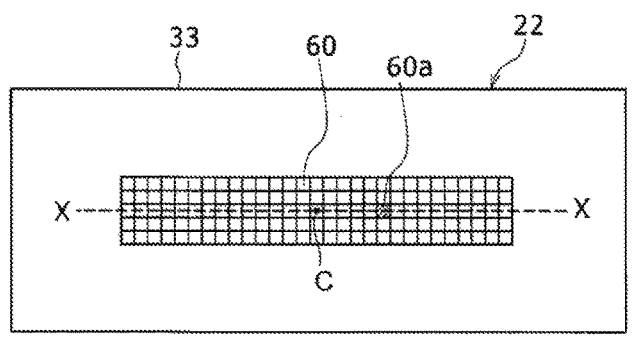
FIGS. 6A to 6C are a view and charts corresponding to FIGS. 5A to 5C in a case where the light source module includes a low-light light source.
Figure 6B:
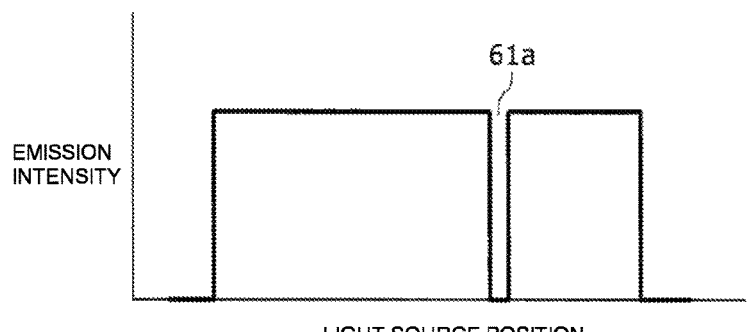
Figure 6C:
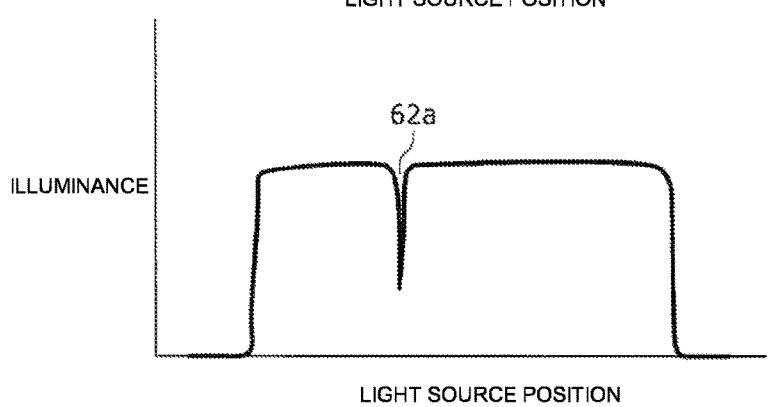

FIG. 6A shows an example when a light source 60a located 10th from the right among the light sources 60 located on line X-X is in a low-light state. In this case, as shown in FIG. 6B, emission intensity at a position 61a corresponding to the light source 60a is lower. Accordingly, as shown in FIG. 6C, illuminance unevenness appears at a position 62a on an irradiated surface which is point symmetric with respect to a central axis C of the projection lens 24, due to passage through the projection lens 24 having the convex surface 24b. As a result, the visibility of a region in front of a driver of the automobile 1 decreases.

Figure 7A:
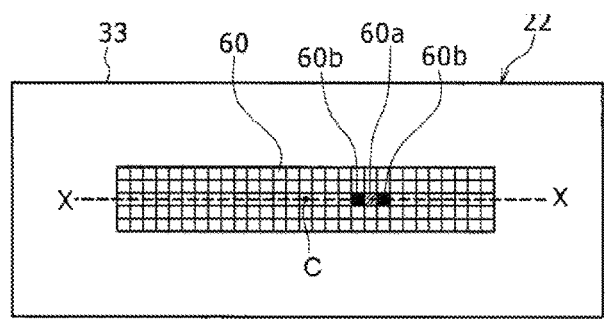
FIGS. 7A to 7C are a view and charts corresponding to FIGS. 5A to 5C in a case where two light sources adjacent to the low-light light source in a row direction are caused to emit light with high luminous intensity.
Figure 7B:
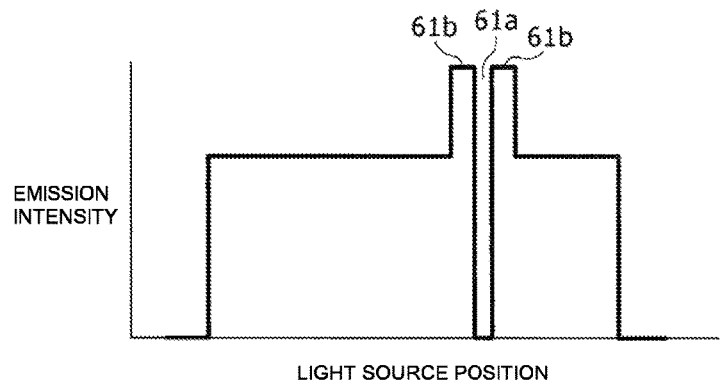
Figure 7C:
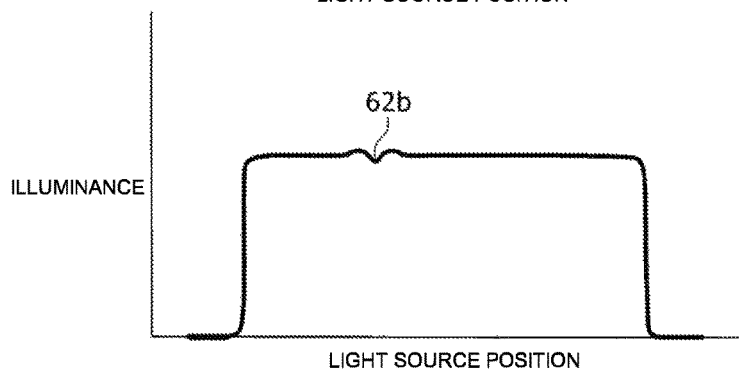

To cope with this, in the lighting device 2 according to the present embodiment, two light sources 60b adjacent to the low-light light source 60a on two sides in a row direction (referring to a direction along a row; the same applies hereinafter) are caused to emit light with higher luminous intensity than at normal times and higher than that of the other light sources 60, as shown in FIG. 7A. As shown in FIG. 7B, this increases emission intensities 61b on two sides in the row direction of the low-luminous-intensity position 61a corresponding to the low-light light source 60a. As a result, as shown in FIG. 7C, an uneven-illuminance spot 62b on an irradiated region is complemented, and almost uniform brightness is achieved. As a result, smoothing of illuminance unevenness improves visibility for a driver.

Note that although an example where the two light sources 60b adjacent to the low-light light source 60a on the two sides in the row direction are caused to emit light with high luminous intensity has been described above, the present disclosure is not limited to this. The light source 60b on either one side alone may be caused to emit light with high luminous intensity. If the low-light light source 60a is located at an end in the row direction, only one light source 60 is adjacent in the row direction.

Figure 8:
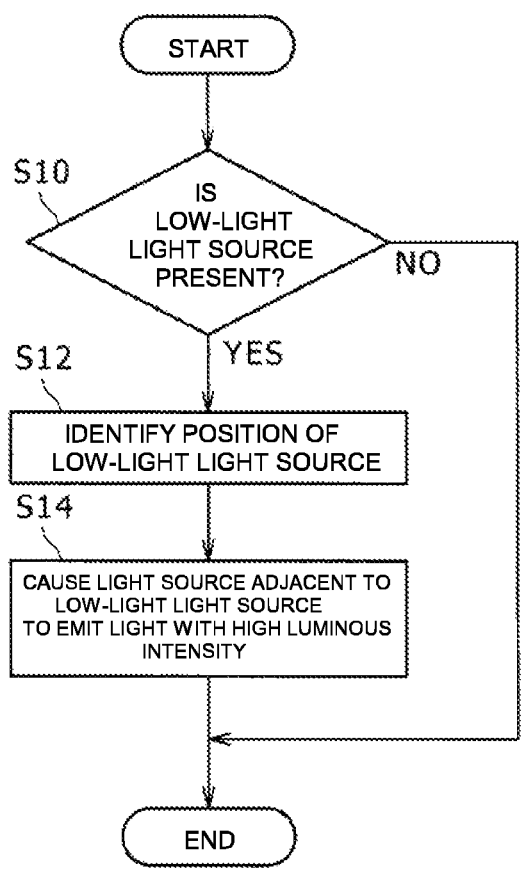
FIG. 8 is a flowchart showing a procedure to be executed by a processor.

FIG. 8 is a flowchart showing the control in the lighting device 2 according to the present embodiment. The processor 6 executes the procedure shown in FIG. 8 each time the lighting device 2 is turned on.

As shown in FIG. 8, the processor 6 judges in step S10 whether the low-light light source 60a is present among the light sources 60 included in the light source module 22. The judgment is made as a function of the detection portion 6a described above (see FIG. 4). More specifically, the judgment is made on the basis of whether a current value input from the current sensor 30a of the drive circuit 30 is smaller than a predetermined threshold. If a negative judgment is made in step S10 (NO in S10), the processor 6 ends the process this time without doing anything (end processing).

On the other hand, if a positive judgment is made in step S10 described above (YES in S10), the processor 6 identifies the position of the low-light light source 60a in succeeding step S12. The process is also executed by the detection portion 6a.

In succeeding step S14, the processor 6 causes at least one light source 60b adjacent to the low-light light source 60a in the row direction to emit with high luminous intensity. The process is executed as a function of the adjustment portion 6b (see FIG. 4) of the processor 6. More specifically, the adjustment portion 6b transmits a command to the transformer circuit 30b of the drive circuit 30 so as to increase a voltage to be applied to the adjacent light source 60b. This causes the adjacent light source 60b to emit light with high luminous intensity and inhibits illuminance unevenness due to the low-light light source 60a.

The processor 6 ends the process (end processing) after the execution of step S14.

As described above, the lighting device 2 according to the present embodiment includes the light source module 22 having the plurality of light sources 60 in a matrix mounted on the board 33, the drive circuit 30 that individually supplies power to the light sources 60, and the processor 6 that controls the lighting status of each light source 60 via the drive circuit 30. The processor 6 includes the detection portion 6a that detects the low-light light source 60a that is lower in luminous intensity than the other light sources 60 among the plurality of light sources 60 and the adjustment portion 6b that causes the light source 60b adjacent to the low-light light source 60a to emit light with higher luminous intensity than the other light sources 60.

With the above-described configuration, since insufficiency of emission intensity due to a low-light light source is compensated for by an adjacent light source, illuminance unevenness of the lighting device 2 is inhibited. As a result, the visibility of an irradiated region is improved.

In this case, preferably, a matrix which the plurality of light sources 60 form has more columns than rows and the processor 6 causes at least one light source 60b adjacent to the low-light light source 60a in the row direction to emit light with higher luminous intensity than the other light sources 60. This allows insufficiency of emission intensity due to a low-light light source to be effectively compensated for by an adjacent light source.

Figure 9A:
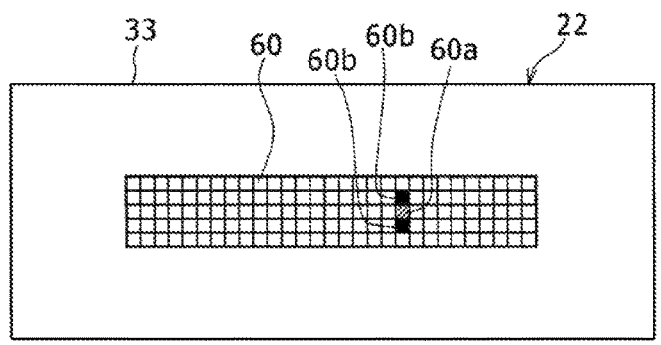
FIGS. 9A to 9C are views showing different patterns in a case where light sources adjacent to the low-light light source are caused to emit high-intensity light.
Figure 9B:
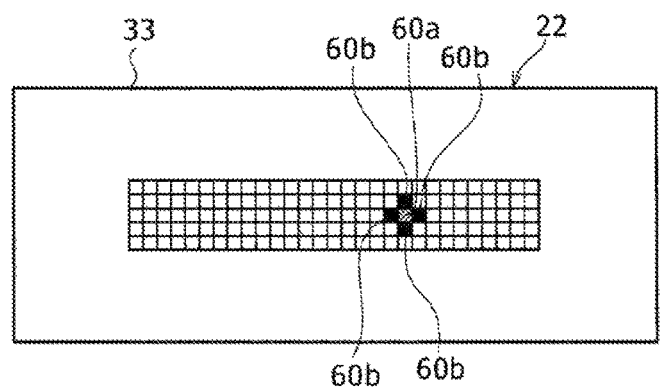
Figure 9C:
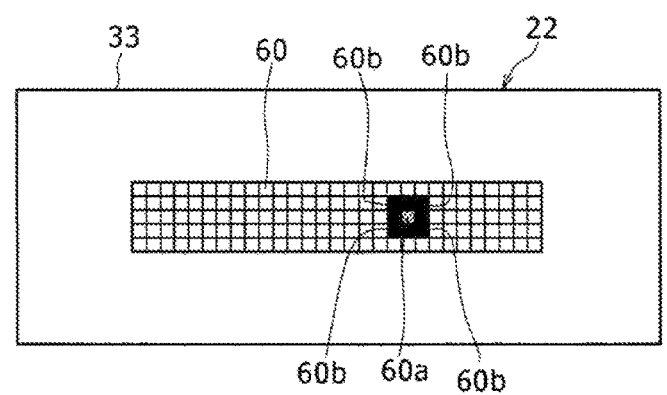

FIGS. 9A to 9C are views showing different patterns in a case where a light source adjacent to a low-light light source is caused to emit high-intensity light.

FIG. 9A shows an example where a matrix which the plurality of light sources 60 form has more columns (29 columns) than rows (five rows), and the processor 6 causes two light sources 60b adjacent to the low-light light source 60a in a column direction (a direction along a column; the same applies hereinafter) to emit light with higher luminous intensity than other LEDs. Even with this configuration, insufficiency of emission intensity due to the low-light light source 60a can be effectively compensated for by the adjacent light sources 60b. Note that even in this case, the light source 60b adjacent on either one side in the column direction alone may be caused to emit light with high luminous intensity.

FIG. 9B shows an example where a matrix which the plurality of light sources 60 form has more columns (29 columns) than rows (five rows), and the processor 6 causes four light sources 60b adjacent to the low-light light source 60a in the row direction and the column direction to emit light with higher luminous intensity than the other light sources 60. In this configuration, the number of light sources 60b that are to be caused to emit light with high luminous intensity is larger. It is thus possible to effectively compensate for insufficiency of emission intensity due to the low-light light source 60a by the adjacent light sources 60b while reducing an increase in emission intensity due to the light sources 60b.

FIG. 9C shows an example where a matrix which the plurality of light sources 60 form has more columns (29 columns) than rows (five rows), and the processor 6 causes eight light sources 60b surrounding and adjacent to the low-light light source 60a to emit light with higher luminous intensity than the other light sources 60. In this configuration, the number of light sources 60b that are to be caused to emit light with high luminous intensity is larger than in the case shown in FIG. 9B. It is thus possible to effectively compensate for insufficiency of emission intensity due to the low-light light source 60a by the adjacent light sources 60b while reducing an increase in emission intensity due to the light sources 60b.

Note that a lighting device according to the present disclosure is not limited to the above-described embodiment and modifications thereof and that various changes and alterations may be made within the scope of the claims of the present application and equivalents thereof.

For example, the plurality of light sources 60 may be divided into a plurality of groups, and the processor 6 may be capable of controlling each group such that the group emits light with predetermined luminous intensity. In this case, the processor 6 may cause all light sources 60b other than the low-light light source 60a in a group including the low-light light source 60a to emit light with high luminous intensity such that the entire group emits light with the predetermined luminous intensity. More specifically, as shown in FIG. 9C, the light sources 60 in five rows and 29 columns constituting the light source module 22 are divided into groups such that a total of nine light sources 60 in three rows and three columns form a group. If the low-light light source 60a is detected among the light sources 60 included in each group, the emission intensity of each light source 60b may be adjusted such that predetermined luminous intensity is achieved by the eight other light sources 60b surrounding and adjacent to the low-light light source 60a. For example, if the low-light light source 60a is in an unlighted state, and the luminous intensity is 0, the eight other light sources 60b may each emit light with luminous intensity about 1.1 times that in normal times so as to complement the low-light light source 60a, thereby performing control such that the luminous intensity of the entire group is kept at the predetermined luminous intensity.

Although the low-light or unlighted light source 60a has been described above as being detected by the current sensor 30a, the present disclosure is not limited to this. For example, illuminance unevenness in an irradiated region may be detected using the camera 3 loaded on the automobile 1, the low-light light source 60a may be identified on the basis of the illuminance unevenness, and control may be performed in the above-described manner such that the low-light light source 60a is complemented by the adjacent light sources 60b.

Although a case where a movable body, on which the lighting device 2 is to be equipped, is an automobile has been described above, a movable body including a lighting device according to the present disclosure may be a vehicle other than an automobile, a ship, an airplane, a robot, or the like.

REFERENCE SIGNS LIST

1 Automobile
2 Lighting device
3 Camera
4 Battery
6 Processor
6a Detection portion
6b Adjustment portion
7 Windshield
21 Case
21a Flat plate portion
21b Case side wall portion
21c Cylinder inner peripheral surface
22 Light source module
23 Primary lens
24 Projection lens 24a Rim portion
24b Convex surface
24c Flat surface
25 Board attachment plate
26 Primary fixation member
27a, 28a Bolt
27b, 28b Nut
30 Drive circuit
30a Current sensor
30b Transformer circuit
33 Board
37 Annular portion
28 Attached portion
39 Coupling portion
40 Light guide portion
51 Light entrance face
52 Light exit face
55 Cable
60 Light source

What is claimed is:

1. A lighting device to be mounted on a movable body, the lighting device comprising:
    a light source module which is composed of a plurality of light sources in a first matrix and mounted on a board;
    a drive circuit which individually supplies power to each of the plurality of light sources to cause each of the plurality of light sources to emit light;
    a primary lens which is composed of a plurality of light guide portions arranged to correspond to the plurality of light sources, respectively, in a second matrix corresponding to the first matrix of the plurality of light sources, each of the plurality of light guide portions comprising a light entrance face through which light from a respective one of the plurality of light sources enters and a light exit face through which the light entering the light entrance face exits;
    a projection lens through which the light exiting the light exit face of each of the plurality of light guide portions passes to be externally emitted; and
    a processor which controls a lighting status of each of the plurality of light sources via the drive circuit,
    wherein the processor detects a low-light light source that is lower in luminous intensity than at least one other light source among the plurality of light sources, and causes at least one light source adjacent to the low-light light source to emit light with higher luminous intensity than the at least one other light source.

2. The lighting device according to claim 1, wherein
    the first matrix includes more columns than rows, and
    the processor causes the at least one light source adjacent to the low-light light source in a row direction to emit the light with the higher luminous intensity than the at least one other light source.

3. The lighting device according to claim 1, wherein
    the first matrix includes more columns than rows, and
    the processor causes the at least one light source adjacent to the low-light light source in a column direction to emit the light with the higher luminous intensity than the at least one other light source.

4. The lighting device according to claim 1, wherein
    the first matrix includes more columns than rows, and
    the processor causes four light sources adjacent to the low-light light source in a row direction and a column direction to emit the light with the higher luminous intensity than the at least one other light source.

5. The lighting device according to claim 1, wherein
    the first matrix includes more columns than rows, and
    the processor causes eight light sources surrounding and adjacent to the low-light light source to emit the light with the higher luminous intensity than the at least one other light source.

6. The lighting device according to claim 1, wherein
    the plurality of light sources is divided into a plurality of groups, and the processor is configured to control each group of the plurality of groups such that each group emits light with a predetermined luminous intensity, and
    the processor causes light sources other than the low-light light source in a group including the low-light light source to emit the light with the high luminous intensity such that the group emits the light with the predetermined luminous intensity.

7. A movable body comprising:
    the lighting device according to claim 1; and
    a camera configured to capture an image of a region irradiated with the light emitted from the plurality of light sources,
    wherein the processor specifies the low-light light source based on the image captured by the camera.

8. The lighting device according to claim 1, further comprising:
    a current sensor which detects the low-light light source by detecting a current flowing through the low-light light source.

9. The lighting device according to claim 1, further comprising:
    a voltage sensor which detects the low-light light source by detecting a voltage applied to the low-light light source.

10. The lighting device according to claim 1, wherein, for each of the plurality of light guide portions, a portion around the light exit face is integrally formed with a portion around the light exit face of at least one adjacent light guide portion.

11. The lighting device according to claim 1, wherein the plurality of light guide portions arranged in a column of the second matrix extend toward the projection lens, in a direction from the light entrance face to the light exit face of each of the plurality of light guide portions arranged in the column, and are non-parallel.

12. The lighting device according to claim 1, wherein the plurality of light guide portions arranged in a row of the second matrix extend toward the projection lens, in a direction from the light entrance face to the light exit face of each of the plurality of light guide portions arranged in the row, and are non-parallel.

13. The lighting device according to claim 1, wherein
    the plurality of light guide portions arranged in each column of the second matrix extend toward the projection lens, in a direction from the light entrance face to the light exit face of each of the plurality of light guide portions arranged in each column, and are non-parallel, and
    the plurality of light guide portions arranged in each row of the second matrix extend toward the projection lens, in a direction from the light entrance face to the light exit face of each of the plurality of light guide portions arranged in the row, and are non-parallel.

14. The lighting device according to claim 13, wherein
    the plurality of light guide portions extend toward the projection lens and converge toward a center of the projection lens.

15. The lighting device according to claim 1, wherein
    a light entrance face of the primary lens which includes the light entrance face of each of the plurality of light sources is larger in size than a light exit face of the primary lens which includes the light exit face of each of the plurality of light sources.

* * * * *